(12) United States Patent
Mevellec

(10) Patent No.: US 8,524,512 B2
(45) Date of Patent: Sep. 3, 2013

(54) METHOD FOR REPAIRING COPPER DIFFUSION BARRIER LAYERS ON A SEMICONDUCTOR SOLID SUBSTRATE AND REPAIR KIT FOR IMPLEMENTING THIS METHOD

(75) Inventor: Vincent Mevellec, Chaville (FR)

(73) Assignee: Alchimer, Massy (FR)

( * ) Notice: Subject to any disclaimer, the term of this patent is extended or adjusted under 35 U.S.C. 154(b) by 226 days.

(21) Appl. No.: 13/003,451

(22) PCT Filed: Sep. 7, 2009

(86) PCT No.: PCT/EP2009/061527
§ 371 (c)(1),
(2), (4) Date: Aug. 16, 2011

(87) PCT Pub. No.: WO2010/026243
PCT Pub. Date: Mar. 11, 2010

(65) Prior Publication Data
US 2011/0294231 A1    Dec. 1, 2011

(30) Foreign Application Priority Data
Sep. 8, 2008  (FR) ...................................... 08 56012

(51) Int. Cl.
*H01L 21/768*  (2006.01)
(52) U.S. Cl.
USPC .......... 438/4; 438/627; 438/653; 257/E23.16; 257/E21.584
(58) Field of Classification Search
USPC ......... 438/4, 627, 653; 257/E23.16, E21.584
See application file for complete search history.

(56) References Cited

U.S. PATENT DOCUMENTS 3,958,048 A    5/1976  Donovan et al.
5,501,893 A    3/1996  Laermer et al.
(Continued)

FOREIGN PATENT DOCUMENTS
EP    0079975    6/1983

OTHER PUBLICATIONS

Lo et al., "Long-term stability of Cu/Pd nanoparticles and their feasibility for electroless copper deposition," Electrochimica Acta, Elsevier Science Publishers, vol. 54, No. 2, pp. 727-732, 2008.

(Continued)

Primary Examiner — George Fourson, III
(74) Attorney, Agent, or Firm — Hamre, Schumann, Mueller & Larson, P.C.

(57) ABSTRACT

Method for repairing copper diffusion barrier layers on a semiconductor solid substrate and repair kit for implementing this method.
One subject of the present invention is a method for repairing a surface of a substrate coated with a discontinuous copper diffusion barrier layer of a titanium-based material.
According to the invention, this method comprises:
  a) the contacting of the surface with a suspension containing copper or copper alloy nanoparticles for a time of between 1 s and 15 min; and
  b) the contacting of the thus treated surface with a liquid solution having a pH of between 8.5 and 12 and containing:
    at least one metal salt,
    at least one reducing agent,
    at least one stabilizer
at a temperature of between 50° C. and 90° C., preferably between 60° C. and 80° C., for a time of between 30 s and 10 min, preferably between 1 min and 5 min, in order to thus form a metallic film having a thickness of at least 50 nanometers re-establishing the continuity of the copper diffusion barrier layer.

31 Claims, 5 Drawing Sheets

(56) References Cited

U.S. PATENT DOCUMENTS

Figure 1:
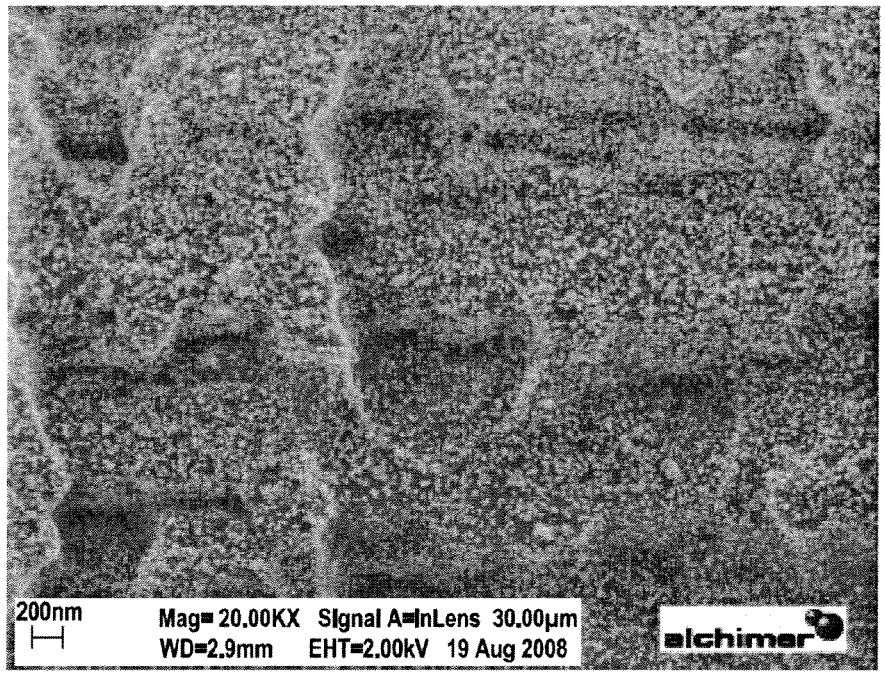

| | | |
|---|---|---|
| 6,136,693 A | 10/2000 | Chan et al. |
| 7,060,624 B2 | 6/2006 | Andricacos et al. |
| 7,101,792 B2 | 9/2006 | Kirby et al. |
| 7,148,565 B2 | 12/2006 | Kim et al. |
| 7,994,640 B1 * | 8/2011 | Alers et al. .................... 257/767 |
| 2003/0040177 A1 | 2/2003 | Kim et al. |
| 2005/0020068 A1 | 1/2005 | Wang et al. |
| 2006/0254503 A1 | 11/2006 | Dai et al. |
| 2007/0293040 A1 * | 12/2007 | Emesh et al. ................. 438/627 |
| 2011/0175228 A1 * | 7/2011 | Lazovsky et al. ............. 257/768 |
| 2011/0294231 A1 * | 12/2011 | Mevellec .......................... 438/4 |

OTHER PUBLICATIONS

Topol et al., "Three-dimensional integrated circuits," IBM J. Res. & Dev., vol. 50, No. 4/5, pp. 491-506, 2006.

* cited by examiner

METHOD FOR REPAIRING COPPER DIFFUSION BARRIER LAYERS ON A SEMICONDUCTOR SOLID SUBSTRATE AND REPAIR KIT FOR IMPLEMENTING THIS METHOD

The present invention relates in general to a method for repairing a surface of a substrate, especially that of a semiconductor substrate which may or may not bear an insulating layer, said substrate being coated with a discontinuous copper diffusion barrier layer, defining the surface to be repaired.

The invention is essentially applicable in the field of microelectronics for the metallization, in particular with copper, of through vias (also called through silicon vias or through wafer vias or through wafer interconnects) which are keystones for three-dimensional (3D) or vertical integration of electronic chips or dies. The invention is also applicable in other fields of electronics in which a substrate having through vias that are covered with an insulating layer and with a discontinuous barrier layer must be treated so as to obtain a continuous barrier layer over the entire surface of the vias. In this context, mention may be made of the fabrication of interconnects in printed circuits (also called printed circuit boards or printed wiring boards) or the fabrication of passive components, such as inductors, or electromechanical components in integrated circuits or microsystems (also called microelectromechanical systems).

Current electronic systems are made up for the most part from several integrated circuits, or components, and each integrated circuit fulfils one or more functions. For example, a computer comprises at least one microprocessor and several memory circuits. Each integrated circuit usually corresponds to an electronic chip in its own package. The integrated circuits are soldered to or plugged into, for example, a printed circuit board or PCB, which ensures connection between the integrated circuits.

The continual need to increase the functionality density of electronic systems has led to a first approach of the "system-on-chip" concept, all the components and circuit blocks needed to carry out all the functions of the system then being produced on the same chip, without using the support of a printed circuit. In practice, it is nevertheless very difficult to obtain a high-performance "system on chip" since the processes for fabricating logic and memory circuits for example differ very substantially. The "system-on-chip" approach has therefore led to accepting compromises as regards the performance of the various functions carried out on the same chip. In addition, the size of such chips and their fabrication yield have reached the limits of their economic feasibility.

A second approach consists in fabricating, in the same package, a module providing the interconnection of several integrated circuits, which may then derive from the same semiconductor substrate or from different substrates. The package thus obtained or MCM (multichip module) thus takes the form of a single component. This MCM approach makes it possible to obtain a higher interconnection density and therefore better performance than the conventional PCB approach. However, it is not fundamentally different therefrom. Apart from the size and weight of the package, the performance of an MCM remains limited by parasitic elements associated with the length of the connections from the substrate and with the wire bonding connecting the substrate or the chips to the pins of the package.

A third approach called "three-dimensional (3D) integration" or "vertical integration" is characterized by the fact that the chips are superposed and connected together by vertical interconnects. The stack obtained thus comprises several layers or strata of active components or chips and constitutes a 3D integrated circuit or 3D IC.

The benefits of 3D integration stem simultaneously:

(1) from the improvement in performance, e.g. the reduction in propagation time and in the dissipated power, the increase in operating speed of the system combined with faster communication between the functional blocks, the increase in bandwidth for each functional block, and the greater immunity to noise;

(2) from the improvement in costs, e.g. increase in integration density, better fabrication yield, thanks to the use of the electronic chip generation most suitable to each functional block, and improvement in reliability; and (3) from the possibility of producing highly integrated systems by the stacking of heterogeneous technologies (also called co-integration), i.e. involving various materials and/or various functional components.

Thus, 3D integration constitutes today an indispensable alternative to the conventional approaches, which have reached their limits in terms of performance, functionality diversification and production cost. The basic principles and advantages of 3D integration have been described for example by A. W. Topol, D. C. La Tulipe, L. Shi, D. J. Frank, K. Bernstein, S. E. Steen, A. Kumar, G. U. Singco, A. M. Young, K. W. Guarini and M. Leong in "Three-dimensional integrated circuits", IBM Journal Res. & Dev., Vol. 50, No. 4/5, July/September 2006, pages 491-506.

After the chips have been stacked, for example by bonding them together, they may be individually connected to the pins of the package by wire bonding. The chips may generally be interconnected by employing through vias.

Thus, the elementary technologies needed to produce three-dimensional integrated circuits comprise in particular the thinning of silicon wafers, the alignment between the layers, the bonding of the layers, and the etching and metallization of the through vias within each layer.

Silicon wafers may be thinned before the through vias are fabricated (e.g. U.S. Pat. Nos. 7,060,624 and 7,148,565).

Alternatively, the vias may be etched and metallized before the silicon wafer is thinned (e.g. U.S. Pat. Nos. 7,060,624 and 7,101,792). In this case, closed or "blind" vias are etched in the silicon and then metallized down to the desired depth before the silicon wafer is thinned, so as to obtain through vias.

The good electrical conductivity of copper and its high resistance to electromigration, i.e. the small amount of copper atoms that migrate under the effect of the electric current density, which can be an important cause of failure, make copper in particular a material of choice for metallizing the through vias.

The through vias of 3D integrated circuits are generally produced in a manner similar to the "damascene" process used in the microelectronics field for the fabrication of interconnects in integrated circuits, in a succession of steps comprising:

etching of the vias in or through the silicon wafer;
deposition of an insulating dielectric layer;
deposition of a barrier layer or liner, serving to prevent the migration or diffusion of copper;
filling of the vias by copper electrodeposition; and
removal of the excess copper by mechanico-chemical polishing.

The barrier layer, because of the high resistivity of the materials constituting it, generally has too high a resistance to allow, by direct electrochemical means, a homogeneous or uniform film of copper to be deposited on the scale of the wafer, a phenomenon known to those skilled in the art as ohmic drop.

It is therefore generally necessary, prior to the step of filling by copper electrodeposition, to cover the barrier layer with a thin metallic copper layer, called a seed layer.

This seed layer may be produced in various ways: by PVD (physical vapor deposition) or CVD (chemical vapor deposition) or by deposition in liquid medium using what is called electrografting technology.

The insulating dielectric layer may be inorganic (generally consisting of silicon dioxide $SiO_2$, silicon nitride SiN or aluminum oxide, for example), deposited by CVD or another process, or may be organic (parylene C, N or D, polyimide, benzocyclobutene or polybenzoxazole for example) deposited by dipping in a liquid medium, or using the SOG (spin-on-glass) method.

The deposition of this insulating layer is followed by the deposition of a copper diffusion barrier layer by vapor phase deposition (PVD, CVD or ALD), said layer generally consisting of tantalum (Ta), titanium (Ti), tantalum nitride (TaN), titanium nitride (TiN), a titanium-tungsten alloy (TiW), tungsten carbonitride (WCN) or a combination of these materials, for example.

Chemical vapor deposition (CVD or ALD) used to deposit the copper diffusion barriers makes it possible to obtain a conformal barrier layer, i.e. one that faithfully matches the topography of the surface to be coated, and to do so for a wide range of aspect ratios defined by the ratio of the depth of the via to the diameter of the via. However, when aspect ratios become too high, for example greater than 5/1, for example around 10/1, the thickness at the bottom of the vias of the barrier layers deposited by CVD becomes too small and results in the formation of local discontinuities. This phenomenon causes the barrier properties to drop in discontinuous zones.

Physical vapor deposition (PVD), which is itself also used for depositing copper diffusion barriers, can be used only in structures having a very low aspect ratio (around 3/1). This is because the thickness of the coating deposited by PVD is directly proportional to the solid angle seen from the surface to be coated. Therefore, those parts of the surface having salient angles are covered with a thicker layer than those parts of the surface having reentrant angles. As a result, the copper diffusion barrier layers formed by physical vapor deposition are not conformal and therefore do not have a uniform thickness at all points on the surface of the substrate.

High-density three-dimensional integrated circuits require the use of anisotropic silicon etching processes so as to obtain vias with a vertical profile. The anisotropic etching of silicon (e.g. U.S. Pat. No. 5,501,893) usually results in a bowed, rough and striated or scalloped profile. Thus, the sidewalls of the vias may in part be not covered, or covered with an insufficient thickness of barrier layer, therefore giving rise to energy dissipation problems due to the diffusion of copper into the insulator and also to less reliable performances.

These drawbacks make it very challenging to produce a perfectly continuous barrier layer suitable for metallizing the through vias of high-density three-dimensional integrated circuits, in which the vias may have high aspect ratios.

Under these conditions, the object of the present invention is to solve this new technical problem by providing a novel method for repairing discontinuous copper diffusion barrier layers present on the surface of a substrate, especially a semiconductor substrate or a semiconductor substrate having an insulating layer, such as in particular a wafer of a silicon-based material which may or may not have an insulating layer.

This novel method is intended in particular for repairing discontinuous copper diffusion barrier layers present on the surface of a substrate having a "through via"-type structure intended for the production of interconnects in integrated circuits, in particular in 3D integrated circuits.

Within the context of the present invention, the expression "discontinuous copper diffusion barrier layer" is understood to mean a layer made of a material that prevents the migration of copper and having either holes or zones of very small thickness through which the copper may migrate. The discontinuity of the copper diffusion barrier layer therefore constitutes a functional discontinuity, the cause of which is, nevertheless, a structural discontinuity in most cases (a hole in the layer).

It has been discovered, and this constitutes the basis of the present invention, that it is possible to solve the aforementioned technical problem, in a completely satisfactory manner on an industrial scale, by treating the surface to be repaired using an electroless process employing very specific chemical compositions.

Completely surprisingly and unexpectedly, it has also been discovered that these specific compositions make it possible not only to reestablish the functionality of a copper diffusion barrier layer over the entire surface of the substrate, including in discontinuous zones of the initial layer, but also to obtain significant improvements not foreseeable to those skilled in the art in terms of adhesion and conformity of the copper layers deposited electrochemically on the surfaces repaired using these compositions.

Thus, one subject of the present invention is a method for repairing a surface of a substrate, especially a semiconductor substrate or a semiconductor substrate bearing an insulating layer, said substrate being coated with a discontinuous copper diffusion barrier layer of a titanium-based material defining said surface to be repaired, which comprises:

a) the contacting of said surface with a suspension containing copper or copper alloy nanoparticles for a time of between 1 s and 15 min, thus causing the nanoparticles to be selectively adsorbed onto the surface of the barrier layer; and b) the contacting of the thus treated surface with a liquid solution having a pH of between 8.5 and 12, preferably between 9 and 11, and containing:
   at least one metal salt, preferably a nickel salt or a salt of a nickel alloy,
   at least one reducing agent, preferably a boron compound, and
   at least one stabilizer at a temperature of between 50° C. and 90° C., preferably between 60° C. and 80° C., for a time of between 30 s and 10 min, preferably between 1 min and 5 min, in order to thus form a metallic film having a thickness of at least 50 nanometers re-establishing the continuity of the copper diffusion barrier layer.

According to one particular feature of the invention, prior to the aforementioned step a), a treatment of said surface enabling the impurities present to be removed may be carried out, such as in particular washing with a solution based on aqueous ammonia and hydrogen peroxide, followed by rinsing with water.

According to another particular feature of the invention, prior to the aforementioned step b), the treated surface obtained after step a) may be rinsed with water.

As seen above, the substrate, the surface of which is intended to be repaired according to the invention, is preferably a semiconductor substrate which may or may not be coated with an insulating layer, and in particular a substrate having a number of through vias, such as those used for the fabrication of three-dimensional integrated circuits.

Within the context of the present invention, the material constituting the copper diffusion barrier layer is a titanium-based material. This material may be substantially pure titanium or a titanium alloy such as, in particular, titanium nitride (TiN), a titanium-tungsten alloy (TiW) or titanium silicon nitride (TiSiN).

The method according to the present invention is essentially characterized in that it comprises two essential steps a) and b), each of them involving a specifically selected composition.

In a completely novel manner, the first step of this method uses a suspension containing copper or copper alloy nanoparticles. It has been observed that such particles have a particularly high affinity with the titanium-based material constituting the copper diffusion barrier layer, this affinity being manifested by selective adsorption of the nanoparticles onto the surface of the barrier layer, with the exception of the discontinuity zones.

In general, the aforementioned nanoparticles have an average size of less than 25 nanometers and more preferably less than 10 nanometers.

The suspensions (or colloidal solutions) containing these nanoparticles may be produced in a manner known per se, by reaction, in the presence of a surfactant-type stabilizer, such as cetyltrimethylammonium bromide (CTMAB), between a copper precursor, in particular copper sulfate, and a reducing agent such as, for example, sodium borohydride. Such suspensions contain the zerovalent copper or copper alloy particles in colloidal form.

Among copper alloys that can be used for the preparation of a suspension suitable for step a), mention may in particular be made of copper-nickel alloys and copper-cobalt alloys.

The nanoparticles are generally present, within the suspension, in an amount of between 0.1 g/l and 10 g/l and preferably between 3 g/l and 6 g/l. The nanoparticles are stabilized using methods widely described in the literature, in such a way that the amount of stabilizer used is between 5 g/l and 100 g/l and preferably between 30 g/l and 50 g/l. The amount of reducing agent used under these conditions is generally between 0.5 g/l and 10 g/l and preferably between 2 g/l and 5 g/l.

The nanoparticles may be selectively adsorbed onto the surface of the titanium-based discontinuous barrier layer by simple contacting of the surface with the suspension containing the copper or copper alloy nanoparticles for a relatively short time, which may be between 1 s and 15 min and preferably between 10 s and 5 min.

The copper or copper alloy nanoparticles thus selectively adsorbed onto the surface of the titanium-based barrier layer make it possible, completely unexpectedly, for a metal film (other than a copper film) to be subsequently formed and for the barrier layer to be repaired.

This metal film may be produced by an electroless process, constituting step b) of the method according to the invention.

For this purpose, the surface of the barrier layer containing the copper or copper alloy nanoparticles is brought into contact, optionally after rinsing it with water, with a liquid solution as defined above under conditions for forming a film having a thickness of at least 50 nanometers.

The thickness of the film formed essentially depends:
on the one hand, on the qualitative and quantitative nature of the liquid treatment solution; and
on the other hand, on the duration of the aforementioned contacting and on the temperature of the solution.

In general, this step b) will be carried out at a temperature of between 50° C. and 90° C., preferably between 60° C. and 80° C., for a time of between 30 s and 10 min, and preferably between 1 min and 5 min.

Excellent results have been obtained using a liquid solution that comprises, in a protic, preferably aqueous, solvent:
1 g/l to 40 g/l, and preferably 20 g/l to 30 g/l, of a metal salt, preferably a nickel salt or a salt of a nickel alloy;
0.5 g/l to 10 g/l, and preferably 2 g/l to 3 g/l, of a reducing agent, preferably a boron compound; and
20 g/l to 100 g/l, and preferably 50 g/l to 70 g/l, of a stabilizer.

With such a solution, used within the aforementioned general temperature range, a metallic film is obtained that has a thickness of between 50 and 200 nanometers for a contacting time of between 1 min and 4 min.

Advantageously, the metal salt, which must be a salt other than a copper salt, is selected from nickel sulfate, nickel chloride, nickel acetate and nickel sulfamate.

The reducing agent used in the solution employed in step b) is advantageously selected from boron derivatives and in particular from dimethyl-aminoborane, sodium borohydride, pyridine borane, morpholene borane and tert-butylamine borane. Preferably, dimethylaminoborane (DMAB) is used.

There is no particular limitation as regards the stabilizer used in the solution employed in step b). This stabilizer is generally selected from the group constituted of ethylenediamine and salts, especially alkali metal or ammonium salts, of acetic, succinic, malonic, aminoacetic, malic or citric acids. Preferably, sodium citrate or tetramethylammonium citrate is used.

The solution employed in step b) generally has a pH of between 8.5 and 12, preferably between 9 and 11. For this purpose, the pH of the solution may be adjusted, in particular by adding a base such as sodium hydroxide.

The method that has been outlined above makes it possible to repair a titanium-based copper diffusion barrier layer having discontinuities.

In addition, this method may be employed for repairing any type of surface and in particular surfaces having high aspect ratios, such as the surface of through vias used for producing interconnects in integrated circuits.

Completely surprisingly and unexpectedly, it has been observed that the barrier layer thus repaired promotes the subsequent adhesion of a copper layer electrochemically deposited on said barrier after repair, the adhesion to a "repaired" barrier layer being greater than the adhesion measured on the same barrier layer but not repaired.

It has also been observed, completely unpredictably, that the method of repair described above results in a significant increase in the conformity of the copper layers subsequently deposited electrochemically.

According to a second aspect, an object of the present invention is a repair kit for repairing a surface of a substrate, especially a semiconductor substrate or a semiconductor substrate bearing an insulating layer, said substrate being coated with a discontinuous copper diffusion barrier layer consisting of a titanium-based material, defining said surface to be repaired, which comprises:
on the one hand, a suspension containing copper or copper alloy nanoparticles, a stabilizer and a reducing agent; and
on the other hand, a liquid solution having a pH of between 8.5 and 12, preferably between 9 and 11, and containing:
at least one metal salt, preferably a nickel salt or a salt of a nickel alloy, at least one reducing agent, preferably a boron compound, and at least one stabilizer.

According to one particular feature, the aforementioned suspension contains:

copper or copper alloy nanoparticles, in an amount of between 0.1 g/l and 10 g/l, and preferably between 3 g/l and 6 g/l;

a stabilizer, in an amount of between 5 g/l and 100 g/l and preferably between 30 g/l and 50 g/l; and a reducing agent in an amount of between 0.5 g/l and 10 g/l, and preferably between 2 g/l and 5 g/l.

According to another particular feature, the aforementioned liquid solution comprises, in a protic, preferably aqueous, solvent:

1 g/l to 40 g/l, and preferably 20 g/l to 30 g/l, of a metal salt, preferably a nickel salt or a salt of a nickel alloy;

0.5 g/l to 10 g/l, and preferably 2 g/l to 3 g/l, of a reducing agent, preferably a boron compound; and 20 g/l to 100 g/l, and preferably 50 g/l to 70 g/l, of a stabilizer.

EXAMPLES

The invention will be better understood on reading the description of the following nonlimiting examples, with reference to the appended figures which show, respectively:

FIG. 1: SEM (scanning electron microscopy) micrograph of the surface of a TiN barrier layer obtained by PVD, after being contacted with a solution of copper nanoparticles according to step 1 of example 1.

Figure 2:
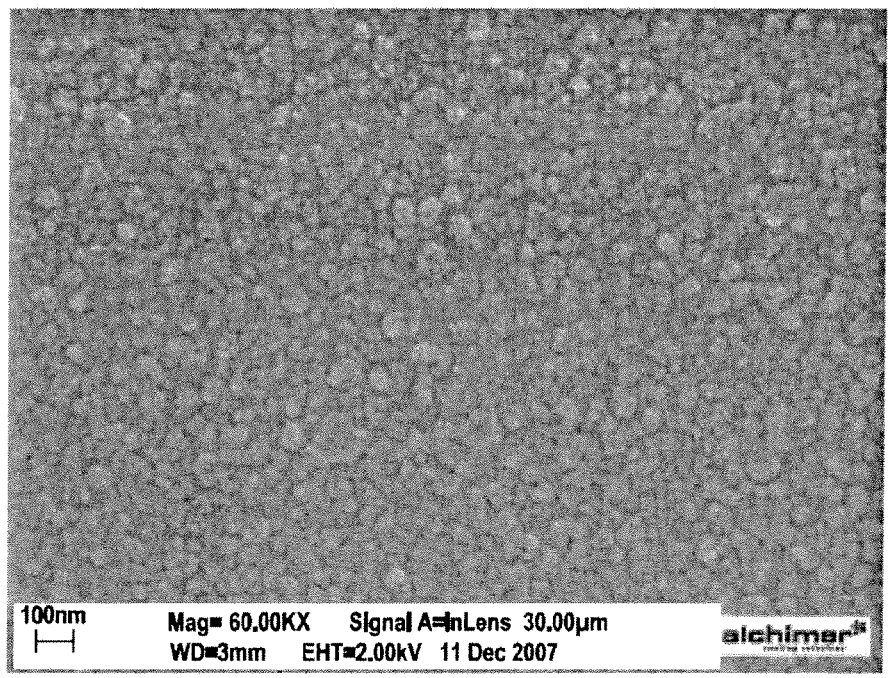

FIG. 2: SEM micrograph of the surface of a TiN barrier layer obtained by PVD, after deposition of an NiB layer initiated by the copper nanoparticles according to step 2 of example 1.

Figure 3:
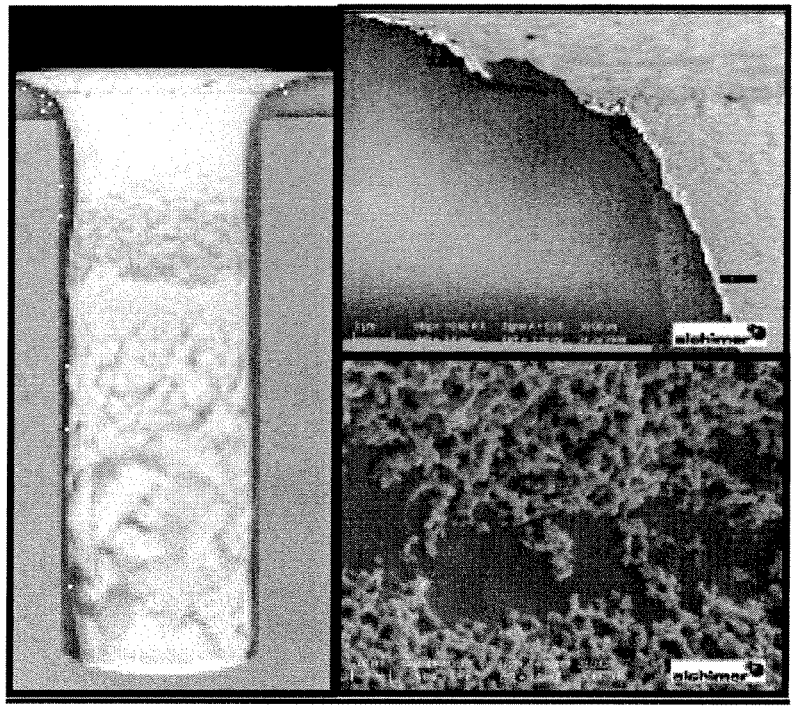

FIG. 3: SEM micrograph of the surface of an unrepaired discontinuous TiW barrier layer obtained by PVD in through vias.

Figure 4:
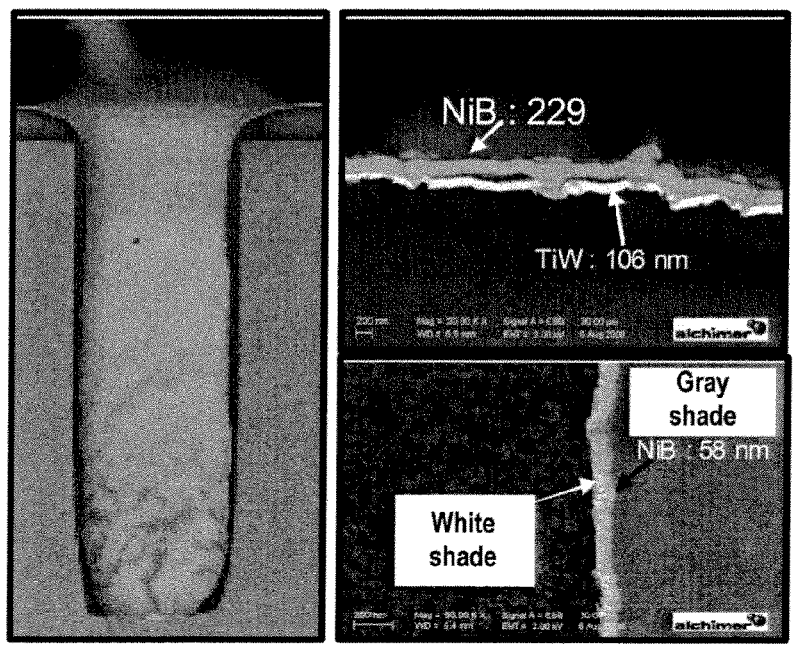

FIG. 4: SEM micrograph of the surface of a discontinuous TiW barrier layer repaired by depositing an NiB layer according to example 2.

Figure 5:
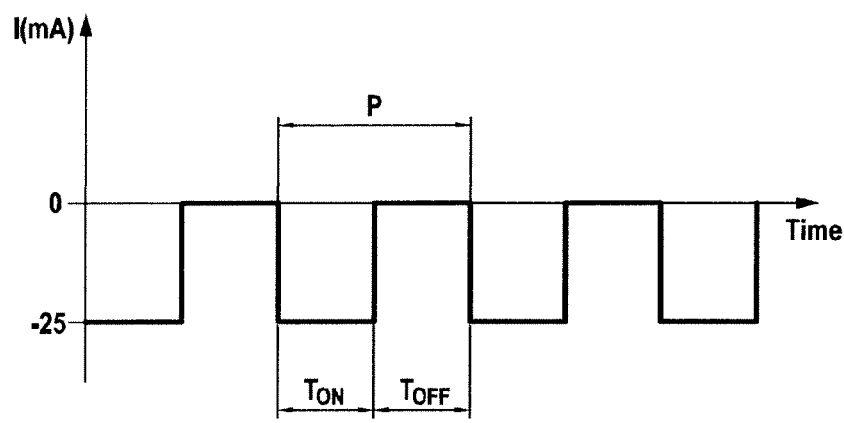

FIG. 5: Schematic representation of the pulsed galvanostatic protocol used to form a copper seed layer on the various barrier layers.

Figure 6:
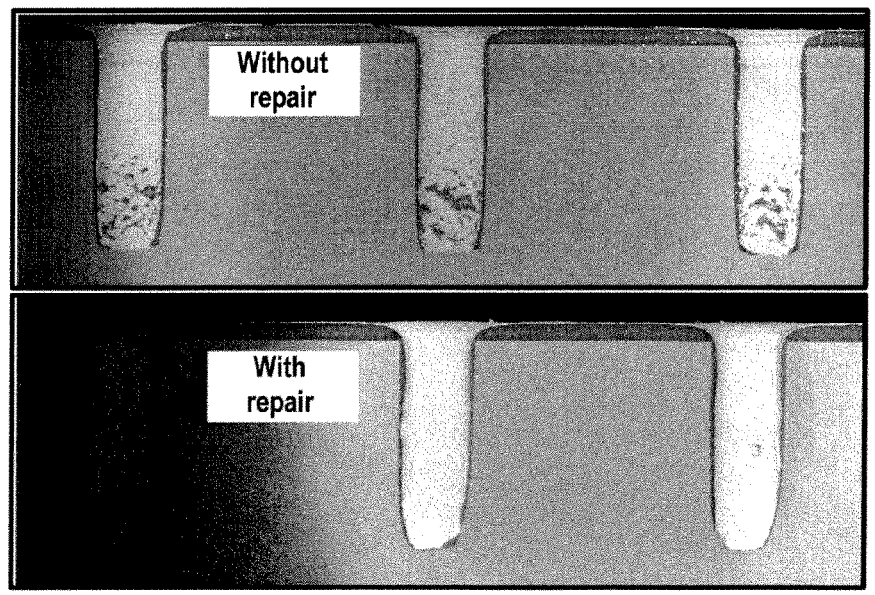

FIG. 6: SEM micrograph of the surface of through vias, said surface being coated with a discontinuous TiW barrier layer obtained by PVD, untreated and treated according to example 2 and then coated with a copper seed layer.

Figure 7:
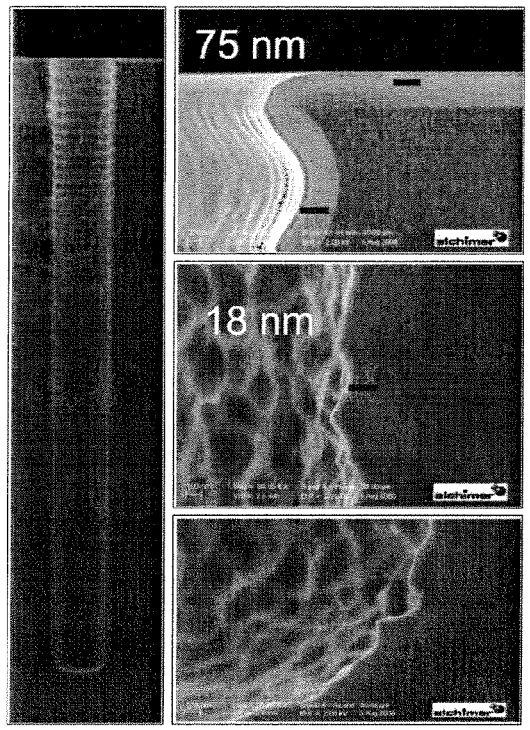

FIG. 7: SEM micrograph of the surface of a discontinuous TiN barrier layer obtained by MOCVD in through vias.

Figure 8:
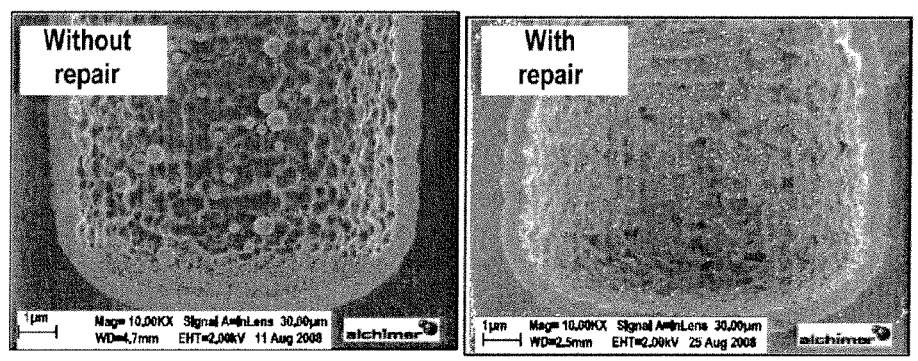

FIG. 8: SEM micrograph of the surface of through vias, said surface being coated with a TiN barrier layer obtained by MOCVD, untreated and treated according to example 3 and then coated with a copper seed layer.

Figure 9:
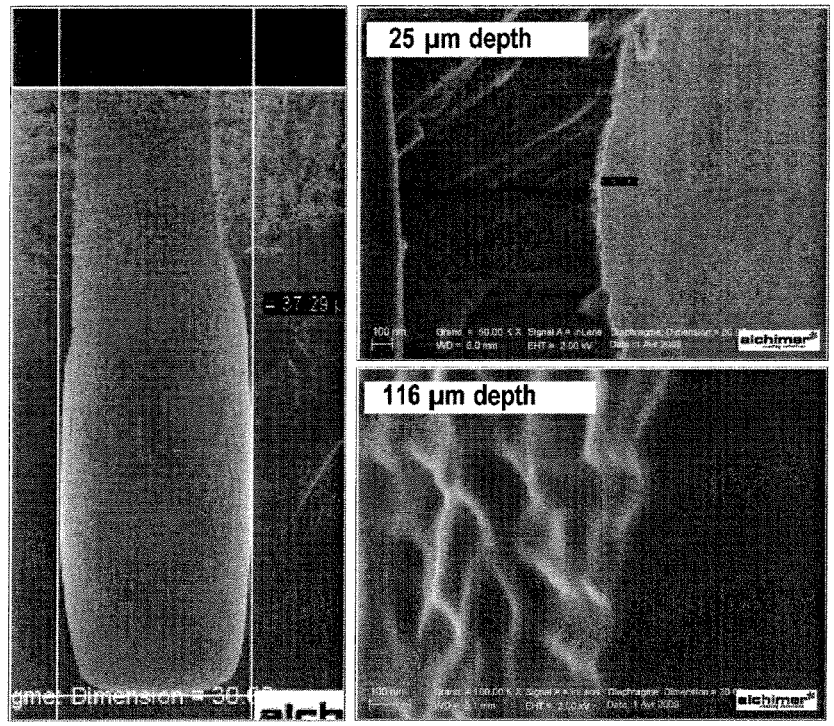

FIG. 9: SEM micrograph of the surface of a discontinuous Ti barrier layer obtained by PVD in through vias.

Figure 10:
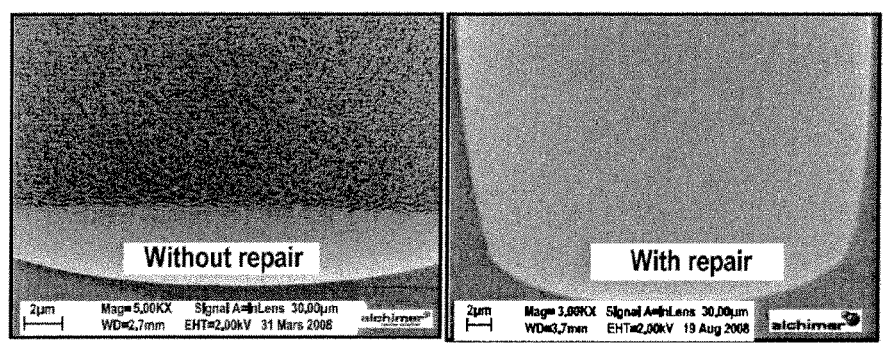

FIG. 10: SEM micrograph of the surface of through vias, said surface being coated with a Ti barrier layer obtained by PVD, untreated and treated according to example 4 and then coated with a copper seed layer.

The following examples were produced on a laboratory scale. In these examples, the following abbreviations are used:

Ti: titanium

TiN: titanium nitride

TiW: titanium-tungsten alloy

PVD: physical vapor deposition

CVD: chemical vapor deposition

MOCVD: metal-organic chemical vapor deposition (by means of an organometallic compound)

$NH_4OH$: ammonium hydroxide $CuSO_4$: copper sulfate

CTAB: cetyltrimethylammonium bromide $NiSO_4$: nickel sulfate

TMAH: tetramethylammonium hydroxide

DMAB: dimethylaminoborane.

Unless otherwise indicated, these examples were produced under standard temperature and pressure conditions (about 25° C. at 1 atmosphere) in the ambient air, and the reactants used were commercially obtained without any additional purification.

Example 1

Formation of a Nickel-Boron Layer on a TiN Barrier Deposited by PVD

This example was produced on a blanket titanium nitride (TiN) substrate having no discontinuity, so as to check the formation of a nickel-boron metal layer on this type of surface.

Substrate:

The substrate used in this example was a silicon coupon with sides of 4 cm (4×4 cm) and a thickness of 750 µm, covered by PVD with TiN having a thickness of 40 nm and a resistivity of 184 µΩ·cm.

Surface Treatment:

Before use, the TiN surfaces were cleaned in a 30% $NH_4OH/35\%\ H_2O_2/H_2O$ mixture in a 1/1/10 volume ratio. The specimen was immersed for one minute in the solution, which was subjected to ultrasound. It was then rinsed freely with water.

Barrier Repair:

A nickel-boron (NiB) barrier was deposited in two steps on the surface of the substrate according to the protocol below:

Step 1: Activation of the Surface by Cooper Nanoparticles:

Solution:

A colloidal suspension of copper nanoparticles was prepared at 20° C. To do this, 250 mg of a $CuSO_4.5H_2O$ (10 mol) metal precursor were dissolved in 50 ml of deionized water and then 1.8 g of a stabilizer, CTAB ($8\times10^{-2}$ mol), were added to this solution. Next, 2 ml of a sodium borohydride solution (100 mg, $5\times10^{-2}$ mol) were added to this solution in a single injection. The solution immediately changed color, becoming red/black characteristic of the zerovalent metal present in colloidal form.

Protocol:

The titanium nitride (TiN) substrate was placed in the colloidal suspension of copper nanoparticles prepared beforehand. The specimen was kept in this solution for a time of about 2 minutes and then rinsed with deionized water for a time of about 1 minute, before being dried in a stream of argon.

Characterization:

Scanning electron microscopy (SEM) analysis (see FIG. 1) was used to reveal the distribution of copper nanoparticles on the surface of the substrate.

Step 2: Formation of a Nickel Layer by Electroless Deposition:

Solution:

The solution used in this example was prepared by pouring, into a pyrex beaker, 50 ml of deionized water, 1.41 g of $NiSO_4$ (0.1M), 2.98 g of tribasic sodium citrate (0.2M) and 141 mg of DMAB ($5\times10^{-2}$M). The pH of the solution was adjusted to 9 by the addition of a 0.1M NaOH (sodium hydroxide) or 0.1M TMAH solution.

Protocol:

The solution was kept at 70° C. in a water bath and then the specimen prepared in step 1 was placed in the medium for a time of about 2 minutes. The substrate was then removed, rinsed with deionized water and dried in a stream of argon.

Characterization:

The surface thus treated was characterized by a uniform metallic (mirror) appearance.

The metal thickness obtained was about 100 nm.

SEM analysis (see FIG. 2) was used to demonstrate the formation of a continuous NiB metal film over the entire surface.

Example 2

Repair of a Discontinuous TiW Barrier Having Through Vias

Substrate:

The substrate used in this example consists of a silicon wafer having sides of 4 cm (4×4 cm) and a thickness of 750 µm, said wafer being etched with cylindrical features of the "through via" type 120 µm in depth and 40 µm in diameter. This substrate was covered with a layer of organic polymer insulator having a thickness of about 2 µm on the walls of the via and about 8 µm on its surface, the bottom surface of the via being free of insulator. This assembly was itself covered by PVD with a TiW barrier layer ranging in thickness from 100 nm to 150 nm and having many holes in the lower part of the via walls (see FIG. 3).

Surface Treatment:

This type of substrate required no prior surface treatment.

Barrier Repair:

This step was carried out in the same way as that described in example 1. However, attachment of the nanoparticles required the specimen to be immersed in the suspension of nanoparticles for one minute in an ultrasonic bath.

Characterization:

The same uniform metallic (mirror) appearance as in example 1 was observed.

SEM analysis (see FIG. 4) was used to demonstrate the formation of a continuous NiB metal film over the entire surface.

Formation of a Copper Seed Layer:

To demonstrate the effectiveness of the above repair, a copper seed layer was deposited on the repaired barrier using the following operating method:

Solution:

A copper seed layer was deposited using an aqueous electroplating solution containing 2.1 ml/l (32 mM) of ethylenediamine and 4 g/l (16 mM) of $CuSO_4.5H_2O$.

Protocol:

The electroplating process used in this example comprised various consecutive steps:

a) a "cold entry" step in which the substrate was brought into contact, by immersion, without being electrically supplied, with the electroplating solution for a time of at least one minute (for example, 3 minutes);

b) a copper growth step in which the substrate is cathodically biased in pulsed galvanostatic mode while simultaneously being rotated at a speed of 20 to 100 rpm (for example, 40 rpm).

FIG. 5 shows in detail the pulsed galvanostatic protocol that can be used, with a total period P of between 10 ms and 2 s (0.6 s in the example), an on-time $T_{ON}$ of between 2 ms and 1.6 s (0.35 s in the example), during which a current per unit area of generally between 0.6 mA·cm$^{-2}$ and 10 mA·cm$^{-2}$ (2.77 mA·cm$^{-2}$ in the example) is imposed, and an off-time $T_{OFF}$ with no bias of between 2 ms and 1.6 s (0.25 s in the example).

The duration of this step depends, as it will be understood, on the desired thickness of the seed layer. This duration can be easily determined by a person skilled in the art, the growth of the film being dependent on the charge passed through the circuit. Under the aforementioned conditions, the deposition rate was about 1.5 nm per coulomb of charge passed through the circuit, thereby giving a duration of the electroplating step of around 17 minutes in order to obtain a coating having a thickness of 300 nm; and c) a "hot exit" step in which the copper-coated substrate was removed from the electroplating solution at zero rotation speed while being kept under voltage bias. The duration of this phase was about 2 seconds.

The rotation speed was then increased to 500 rpm for 10 seconds, the cathodic bias being cut off during this last phase. The substrate was then rinsed with deionized water and dried in a stream of nitrogen.

Characterization:

SEM analysis (see FIG. 6) was used to demonstrate the stack of the three, TiW/NiB/copper, layers over the entire surface of the via before and after repair.

Example 3

Repair of a TiN Barrier on a Silicon Surface Having Through Vias, Followed by Deposition of a Copper Seed Layer In order for the effectiveness of the repair to be precisely displayed, a copper seed layer was deposited on a substrate having through vias, either immediately or after the repair step.

Substrate:

The substrate used in this example consisted of a silicon wafer with sides of 4 cm (4×4 cm) and a thickness of 750 µm, said wafer being etched with cylindrical features of the "through via" type 100 µm in depth and 10 µm in diameter. An insulator ($SiO_2$) first layer having a thickness of 0.5 µm was present. This layer was covered with a TiN barrier of about 75 nm deposited by MOCVD, but not reaching the bottom and the lower part of the walls of the via (see FIG. 7).

Surface Treatment:

This step was carried out in the same way as that described in example 1.

Barrier Repair:

This step was carried out in the same way as that described in example 2.

Formation of a Copper Seed Layer:

This step was carried out in the same way as that described in example 2.

Characterization:

SEM analysis (see FIG. 8) was used to demonstrate the stack of the three, TiN/NiB/copper, layers over the entire surface of the via with and without repair.

Example 4

Repair of a Ti Barrier on a Silicon Surface Having Through Vias, Followed by Deposition of a Copper Seed Layer Substrate:

The substrate used in this example consists of a silicon wafer having sides of 4 cm (4×4 cm) and a thickness of 750 µm, said wafer being etched with cylindrical features of the "through via" type 120 µm in depth and 35 µm in diameter. A Ti barrier layer was deposited by PVD. This layer had a thickness that dropped very rapidly, becoming less than 5 nm from a depth of 80 µm onwards in the via (see FIG. 9).

Surface Treatment:

This step was carried out in the same way as that described in example 1.

Barrier Repair:

This step was carried out in the same way as that described in example 2.

Formation of a Copper Seed Layer:

This step was carried out in the same way as that described in example 2.

Characterization:

SEM analysis (see FIG. 10) was used to demonstrate the stack of the three, Ti/NiB/copper, layers over the entire surface of the via with and without repair.

The measurements of the copper seed layer thicknesses over the entire surface of a via showed a significant increase in the conformity of the layers after repair. The measured copper thicknesses at the bottom of a via thus increased from 38 nm without repair to 154 nm after repair for copper thicknesses of about 350 nm at the top of the via.

Example 5

Measurement of the Adhesion of a Copper Seed Layer Deposited Electrochemically on a TiN Barrier with and without Repair The substrate used in this example was the same as that used in example 1.

A copper seed layer was deposited on several specimens according to the protocol described in example 2.

A first series of copper layers were deposited on unrepaired TiN barriers followed by a second series on TiN barriers after repair.

The results obtained are given in table 1.

TABLE 1

Measurement of the adhesion of a copper seed layer deposited electrochemically on a TiN barrier with and without repair

| Substrate | Copper thickness (nm) | Adhesion (J/m$^2$) |
|---|---|---|
| TiN | 380 | 2.3 |
| TiN | 370 | 2.1 |
| TiN | 380 | 2.1 |
| TiN after repair | 390 | 7.8 |
| TiN after repair | 380 | 7.9 |
| TiN after repair | 380 | 7.9 |

The results given in table 1 show that the method of repairing the TiN barrier significantly improves the adhesion of the copper layer electrochemically deposited on the barrier layer.

It has also been observed that the copper layers obtained exhibit excellent conformity, greatly superior to that of the copper layers deposited on the surface of an unrepaired discontinuous barrier layer.

Finally, the method according to the present invention is particularly advantageous because it can be carried out entirely in a wet phase, preferably a liquid phase in a protic solvent, and more preferably in an aqueous phase.

The invention claimed is:

1. A method for repairing a surface of a substrate, said substrate being coated with a discontinuous copper diffusion barrier layer of a titanium-based material defining said surface to be repaired, which comprises:
    a) contacting said surface with a suspension containing copper or copper alloy nanoparticles for a time of between 1 s and 15 min, thus causing the nanoparticles to be selectively adsorbed onto the surface of the barrier layer; and
    b) contacting the thus treated surface with a liquid solution having a pH of between 8.5 and 12 and comprising:
        at least one metal salt,
        at least one reducing agent, and
        at least one stabilizer at a temperature of between 50° C. and 90° C., for a time of between 30 s and 10 min, in order to thus form a metallic film having a thickness of at least 50 nanometers re-establishing the continuity of the copper diffusion barrier layer.

2. The method as claimed in claim 1, wherein said substrate is a semiconductor substrate or a semiconductor substrate bearing an insulating layer.

3. The method as claimed in claim 1, which comprises, prior to the step a), a treatment of said surface enabling impurities present to be removed.

4. The method as claimed in claim 3, wherein said treatment of said surface enabling the impurities present to be removed comprises washing said surface with a solution containing hydrogen peroxide and aqueous ammonia followed by rinsing with water.

5. The method as claimed in claim 1, which comprises, prior to the step b), rinsing the treated surface obtained after step a) with water.

6. The method as claimed in claim 3, which comprises, prior to the step b), rinsing the treated surface obtained after step a) with water.

7. The method as claimed in claim 1, wherein the liquid solution used in the step b) has a pH of between 9 and 11, and comprises:
    at least one metal salt, which is a nickel salt or a salt of a nickel alloy,
    at least one reducing agent, which is a boron compound, and
    at least one stabilizer at a temperature of between 60° C. and 80° C., for a time of between 1 min and 5 min.

8. The method as claimed in claim 7, which comprises, prior to the step a), a treatment of said surface enabling the impurities present to be removed.

9. The method as claimed in claim 7, which comprises, prior to the step b), rinsing the treated surface obtained after step a) with water.

10. The method as claimed in claim 1, wherein the liquid solution used in the step b) comprises, in a protic solvent:
    1 g/l to 40 g/l of a metal salt;
    0.5 g/l to 10 g/l of a reducing agent; and
    20 g/l to 100 g/l of a stabilizer.

11. The method as claimed in claim 1, wherein the liquid solution used in the step b) comprises, in an aqueous solvent:
    20 g/l to 30/l, of a metal salt, which is a nickel salt or a salt of a nickel alloy;
    2 g/l to 3 g/l, of a reducing agent, which is a boron compound; and
    50 g/l to 70 g/l of a stabilizer.

12. The method as claimed in claim 1, wherein the metal salt is selected from the group consisting of nickel sulfate, nickel chloride, nickel acetate and nickel sulfamate.

13. The method as claimed in claim 7, wherein the metal salt is selected from the group consisting of nickel sulfate, nickel chloride, nickel acetate and nickel sulfamate.

14. The method as claimed in claim 1, wherein the reducing agent is selected from the group consisting of sodium borohydride ($NaBH_4$), dimethylaminoborane (DMAB), morpholene borane, tert-butylamine borane and pyridine borane.

15. The method as claimed in claim 7, wherein the reducing agent is selected from the group consisting of sodium borohydride ($NaBH_4$), dimethylaminoborane (DMAB), morpholene borane, tert-butylamine borane and pyridine borane.

16. The method as claimed in claim 11, wherein the reducing agent is selected from the group consisting of sodium borohydride ($NaBH_4$), dimethylaminoborane (DMAB), morpholene borane, tert-butylamine borane and pyridine borane.

17. The method as claimed in claim 1, wherein the stabilizer is selected from the group consisting of
    ethylenediamine;
    alkali metal of an acid selected from the group consisting of acetic acid, succinic acid, malonic acid, aminoacetic acid, malic acid and citric acid;
    ammonium salt of an acid selected from the group consisting of acetic acid, succinic acid, malonic acid, aminoacetic acid, malic acid and citric acid.

18. The method as claimed in claim 7, wherein the stabilizer is selected from the group consisting of:
    ethylenediamine;
    alkali metal of an acid selected from the group consisting of acetic acid, succinic acid, malonic acid, aminoacetic acid, malic acid and citric acid;
    ammonium salt of an acid selected from the group consisting of acetic acid, succinic acid, malonic acid, aminoacetic acid, malic acid and citric acid.

19. The method as claimed in claim 11, wherein the stabilizer is selected from the group consisting of:
    ethylenediamine;
    alkali metal of an acid selected from the group consisting of acetic acid, succinic acid, malonic acid, aminoacetic acid, malic acid and citric acid;
    ammonium salt of an acid selected from the group consisting of acetic acid, succinic acid, malonic acid, aminoacetic acid, malic acid and citric acid.

20. The method as claimed in claim 1, wherein the substrate is a semiconductor substrate coated with an insulating layer having a number of cylindrical features of the "through via" type.

21. The method as claimed in claim 1, wherein the substrate is a semiconductor substrate coated with an insulating layer having a number of cylindrical features of the "through via" type used for the fabrication of three-dimensional integrated circuits.

22. A repair kit for repairing a surface of a substrate, said substrate being coated with a discontinuous copper diffusion barrier layer consisting of a titanium-based material, defining said surface to be repaired, which comprises:
    a suspension containing copper or copper alloy nanoparticles, a stabilizer and a reducing agent; and
    a liquid solution having a pH of between 8.5 and 12, and comprising:
        at least one metal salt,
        at least one reducing agent, and
        at least one stabilizer.

23. The repair kit as claimed in claim 22, wherein said substrate is a semiconductor substrate or a semiconductor substrate bearing an insulating layer.

24. The repair kit as claimed in claim 22, wherein the liquid solution has a pH of between 9 and 11, and comprises:
    at least one metal salt, which is a nickel salt or a salt of a nickel alloy,
    at least one reducing agent, which is a boron compound, and
    at least one stabilizer.

25. The repair kit as claimed in claim 22, wherein the suspension comprises:
    copper or copper alloy nanoparticles, in an amount of between 0.1 g/l and 10 g/l;
    a stabilizer, in an amount of between 5 g/l and 100 g/l; and
    a reducing agent in an amount of between 0.5 g/l and 10 g/l.

26. The repair kit as claimed in claim 25, wherein the suspension comprises:
    copper or copper alloy nanoparticles, in an amount of between 3 g/l and 6 g/l;
    a stabilizer, in an amount of between 30 g/l and 50 g/l; and
    a reducing agent in an amount of between 2 g/l and 5 g/l.

27. The repair kit as claimed in claim 22, wherein the liquid solution comprises, in a protic solvent:
    1 g/l to 40 g/l, of a metal salt;
    0.5 g/l to 10 g/l, of a reducing agent; and
    20 g/l to 100 g/l, of a stabilizer.

28. The repair kit as claimed in claim 27, wherein the liquid solution comprises, in an aqueous, solvent:
    20 g/l to 30 g/l, of a metal salt which is a nickel salt or a salt of a nickel alloy;
    2 g/l to 3 g/l, of a reducing agent, which is a boron compound; and
    50 g/l to 70 g/l, of a stabilizer.

29. The repair kit as claimed in claim 22, wherein the reducing agent is selected from the group consisting of sodium borohydride ($NaBH_4$), dimethylaminoborane (DMAB), morpholene borane, tert-butylamine borane and pyridine borane.

30. The repair kit as claimed in claim 22, wherein the stabilizer is selected from the group consisting of
    ethylenediamine;
    alkali metal of an acid selected from the group consisting of acetic acid, succinic acid, malonic acid, aminoacetic acid, malic acid and citric acid;
    ammonium salt of an acid selected from the group consisting of acetic acid, succinic acid, malonic acid, aminoacetic acid, malic acid and citric acid.

31. The repair kit as claimed in claim 22, wherein the metal salt is selected from the group consisting of nickel sulfate, nickel chloride, nickel acetate and nickel sulfamate.

* * * * *